US011368150B2

(12) United States Patent
Wang et al.

(10) Patent No.: US 11,368,150 B2
(45) Date of Patent: Jun. 21, 2022

(54) RELIABTILITY MONITOR FOR FIELD EFFECT TRANSISTOR DEVICES

(71) Applicant: TEXAS INSTRUMENTS INCORPORATED, Dallas, TX (US)

(72) Inventors: Gangyao Wang, Cary, NC (US); Xiong Li, Allen, TX (US); Suxuan Guo, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/555,482

(22) Filed: Aug. 29, 2019

(65) Prior Publication Data

US 2020/0235731 A1    Jul. 23, 2020

Related U.S. Application Data

(60) Provisional application No. 62/793,592, filed on Jan. 17, 2019.

(51) Int. Cl.
*H03K 17/18*     (2006.01)
*H03K 17/687*   (2006.01)

(52) U.S. Cl.
CPC .......... *H03K 17/18* (2013.01); *H03K 17/687* (2013.01)

(58) Field of Classification Search
CPC ............................. H03K 17/18; H03K 17/687
See application file for complete search history.

(56) References Cited

U.S. PATENT DOCUMENTS

| 5,396,412 | A | 3/1995 | Barlage |
| 6,630,748 | B2 * | 10/2003 | Sato ................... H03K 17/0822 307/10.1 |
| 7,339,773 | B2 * | 3/2008 | Gergintschew .... H03K 17/0822 361/100 |
| 7,636,249 | B2 * | 12/2009 | Hu .................... H02M 3/33592 363/127 |
| 9,906,214 | B2 * | 2/2018 | Mourrier .............. H02H 7/0844 |
| 10,074,967 | B2 * | 9/2018 | Norling ................. H03K 17/18 |

(Continued)

OTHER PUBLICATIONS

Celaya, J., et al., "Accelerated Aging System for Prognostics of Power Semiconductor Devices," IEEE 2010, Conference, Autotestcon, 6 pages.

(Continued)

*Primary Examiner* — Dinh T Le
(74) *Attorney, Agent, or Firm* — Michelle F. Murray; Charles A. Brill; Frank D. Cimino

(57) ABSTRACT

A device includes an output circuit configured to drive a gate of a field effect transistor (FET) in response to a drive signal. The FET includes a body diode. Control logic is configured to generate the drive signal to control the output circuit to drive the FET. A measurement circuit is configured to sample a first voltage across the FET in response to a first state of the drive signal and configured to sample a second voltage across the FET in response to a second state of the drive signal. The second state of the drive signal is different from the first state. The control logic is configured to determine a difference between the first voltage and a reference voltage. The control logic is configured to compare the difference to a degradation threshold to determine a level of degradation of the FET. The reference voltage is determined based on the second voltage.

22 Claims, 7 Drawing Sheets

(56) References Cited

U.S. PATENT DOCUMENTS

| | | | |
|---|---|---|---|
| 10,244,609 B2* | 3/2019 | Siessegger | H05B 45/00 |
| 10,404,251 B2* | 9/2019 | Chen | H03K 17/04123 |
| 10,728,960 B2* | 7/2020 | Bredemeier | H01L 27/0255 |
| 2002/0167011 A1 | 11/2002 | Kumar et al. | |
| 2018/0059151 A1* | 3/2018 | Trescases | G01R 15/08 |
| 2020/0204172 A1* | 6/2020 | Geng | H03K 17/284 |

OTHER PUBLICATIONS

Wu, L., et al., "Anomaly Detection and Degradation Prediction of MOSFET," Mathematical Problems in Engineering, vol. 2015, Article ID 573980, Aug. 6, 2015, 5 pages.

International Search Report and Written Opinion dated Apr. 30, 2020, PCT Application No. PCT/US2020/014147, 8 pages.

* cited by examiner

RELIABILITY MONITOR FOR FIELD EFFECT TRANSISTOR DEVICES

CROSS REFERENCE TO RELATED APPLICATIONS

This application claims the benefit of U.S. Provisional Patent Application 62/793,592 filed on 17 Jan. 2019, and entitled A NOVEL ISOLATED GATE DRIVER WITH VSD MEASUREMENT CAPABILITY FOR THE STATE OF HEALTH MONITOR OF SIC MOSFETS, the entirety of which is incorporated by reference herein.

TECHNICAL FIELD

This disclosure relates to a system, circuit, method, and device that determines an indication of reliability for a Field Effect Transistor (FET) device.

BACKGROUND

A field-effect transistor (FET) is an electronic device which uses an electric field to control the flow of current. FETs are three-terminal devices, having a source, gate, and drain terminal, where multiple FETs can often be paralleled and packaged as a power module. The flow of current through from the source to the drain of the FET is controlled by the application of a voltage to the gate terminal, which alters the conductivity between the drain and source terminals. FET devices also include a body diode that allows current to flow from the drain to the source in certain conditions. Modern FET devices are relatively robust, especially when operated within the temperature and electrical limitations defined by the manufacturer. However, both the FET and the body diode can degrade as power is delivered through the device which can reduce the reliability of the device over time.

SUMMARY

In one example, a device includes an output circuit configured to drive a gate of a field effect transistor (FET) in response to a drive signal. The FET includes a body diode. Control logic is configured to generate the drive signal to control the output circuit to drive the FET. A measurement circuit is configured to sample a first voltage across the FET in response to a first state of the drive signal and configured to sample a second voltage across the FET in response to a second state of the drive signal. The second state of the drive signal is different from the first state. The control logic is configured to determine a difference between the first voltage and a reference voltage. The control logic is configured to compare the difference to a degradation threshold to determine a level of degradation of the FET. The reference voltage is determined based on the second voltage.

In another example, a system includes a Silicon Carbide (SiC) field effect transistor (FET) having a gate. An output circuit is configured to apply a first gate voltage to the gate in response to a drive signal having a first state and configured to apply a second gate voltage to the gate in response to the drive signal having a second state. The second gate voltage is different from the first gate voltage. A measurement circuit is coupled to receive a voltage measurement across the SiC FET. The measurement circuit is configured to sample a first voltage across the SiC FET in response to the first gate voltage and configured to sample a second voltage across the FET in response to the second gate voltage. Control logic is configured to provide the drive signal to the output circuit. The control logic is configured to determine a difference between the first voltage and a reference voltage. The control logic is configured to compare the difference to a degradation threshold to determine a level of degradation of the SiC FET. The reference voltage is determined based on the second voltage.

In yet another example, a method includes measuring a first voltage across a field effect transistor (FET) in response to a first gate voltage applied to a gate of the FET. The method includes measuring a second voltage across the FET in response to a second gate voltage applied to the gate of the FET. The second gate voltage is different than the first gate voltage. The method includes determining a junction temperature for the FET based on the second voltage. The method includes determining a reference voltage for the FET based on the junction temperature of the FET. The reference voltage is representative of a voltage across the FET in a non-degraded state at the junction temperature of the FET. The method includes determining a difference between the first voltage and the reference voltage. The method includes comparing the difference to a degradation threshold to determine a level of degradation for the FET.

In still yet another example, one or more non-transitory storage media storing a set of instructions, which upon being executed by a processing element, cause the processing element to control an output driver to apply a first gate voltage to a gate of a field effect transistor (FET) in response to a first drive signal. The instructions store a first value representative of a voltage across the FET in response to the first gate voltage. The instructions control the output driver to apply a second gate voltage to the gate of the FET in response to a second drive signal. The second gate voltage is different from the first gate voltage. The instructions store a second value representative of the voltage across the FET in response to the second gate voltage. The instructions determine a junction temperature of the FET based on the second value. The instructions determine a reference voltage for the FET based on the junction temperature. The instructions determine a difference between the first value and the reference voltage. The instructions determine a level of degradation for the FET based on comparing the difference to a degradation threshold.

DETAILED DESCRIPTION

Figure 1:
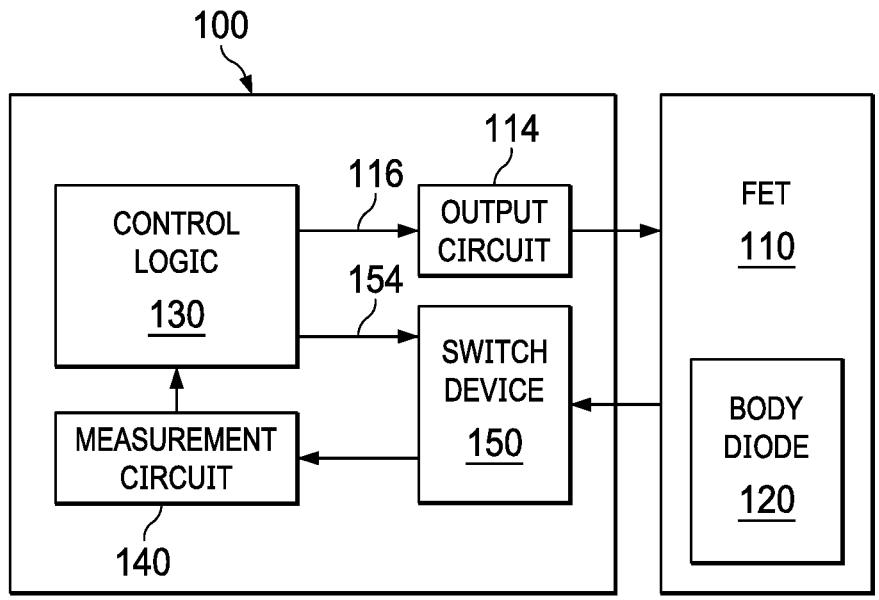
FIG. 1 illustrates an example block diagram of a device to determine reliability level of degradation for a field effect transistor.

This disclosure introduces a device, system, and method to determine a level of degradation for a field effect transistor (FET). For example, a system includes control logic configured to generate drive signals that cause different voltages to be applied to the gate of the FET. As an example, the control logic is implemented as part of a gate driver circuit, such as including a control circuit, a controller, a processor or the like. A first voltage is applied to the gate of the FET in response to a first drive signal that provides current through a body diode of the FET. A second gate voltage is applied in response to a second drive signal that provides current through a channel of the FET. The control logic also controls a measurement circuit that is configured to sample voltages across the FET (e.g., source-to-drain voltage) in response to the respective drive signals.

As an example, the FET voltage measurements may be collected as part of a diagnostic phase during startup to determine an indication of health and reliability status of the FET (e.g., a silicon carbide (SiC) FET). Because each of the first and second drive signals causes current to flow through different paths of the FET, each of the respective sampled voltages in response to the drive signals may provide a signature representative of a respective health attribute of the FET. As used herein in the context of a FET, the term "signature" refers to a value that is measured or derived from a measurement to contain information that is representative of physical and/or operating properties of the FET. For example, a first voltage across the FET sampled in response to the first drive signal (e.g., providing current through the FET channel) may provide a first signature representative of a voltage that indicates a current state of the FET which potentially indicates die degradation.

A second voltage across the FET sampled in response to the second drive signal (e.g., providing current through the body diode) may provide a second signature representative of die temperature of the FET. Thus, the second signature can be utilized to determine information regarding the FET in a reference state, such as a non-degraded state of the FET. The control logic further may be configured to compare the first and second signatures of the FET to determine a level of degradation for the given FET. For example, the control logic generates a degradation output signal based on the comparison, such as to indicate a level of degradation for the FET. The degradation output signal can be used to trigger an alert by one or more external systems (e.g., a message alert, such as an email or text) or otherwise inform operators (e.g., an LED alert on a panel display) that can lead to maintenance actions to replace the FET.

As another example, the control logic is configured to determine a junction temperature for the FET based on the second voltage sampled across the FET. The control logic can then utilize the junction temperature for the FET to determine a reference voltage representative of a source-to-drain voltage for the FET in a non-degraded (e.g., ideal) condition. The control logic is configured to provide the level of degradation based on a difference between the reference voltage and the first voltage sampled across the FET. For example, the level of degradation provides a measure of the difference between a non-degraded state for the FET (e.g., stored reference voltage values before the FET has been used) and a potentially degraded current state after the FET has been used and cycled over time.

As a further example, the level of degradation of the FET is determined according to a diagnostic start-up routine. In one example, the level of degradation of the FET can be communicated locally to a user (e.g., LED display on a printed circuit board containing or attached to the FET). In another example, the level of degradation can be communicated remotely to another system (e.g., electronic message) to notify a user and/or system that the FET may be operating below an expected performance level and thus should be replaced.

By performing temperature and other diagnostic analysis of the FET, as disclosed herein, dedicated temperature sensors or other temperature measurement circuits are not required and thus may be omitted in contrast to many existing designs that may employ temperature sensor monitoring. This can result in a significant reduction in the complexity and size of the circuit, which can realize significant cost savings in the design and fabrication of such circuits. Also, the approach described herein can determine temperature with increased accuracy because the temperature signature provides a direct measure of die temperature (e.g., across the PN junction of the FET) without utilizing a separate sensor located away from the die.

As used herein, the term "circuit" can include a collection of active and/or passive elements that perform a circuit function, such as an analog circuit or digital circuit. Additionally or alternatively, for example, the term "circuit" can include an IC where all or some of the circuit elements are fabricated on a common substrate (e.g., semiconductor substrate, such as a die or chip), such as disclosed herein. For example, the circuit and/or associated control circuitry may be implemented as a respective IC chip or within a multi-chip module. A control logic circuit can include discrete components configured to execute a control function. In other examples, the control logic circuit can include a controller, processor, digital signal processor, or gate array.

Additionally, the term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A based on the control signal generated by device A.

FIG. 1 illustrates an example of a device 100 configured to determine a level of degradation for a field effect transistor (FET) 110, which includes a body diode 120. The device 100 includes an output circuit 114 configured to drive a gate of the FET 110 in response to a drive signal 116. The FET 110 can be substantially any type of field effect transistor that includes the body diode 120 (e.g., metallic oxide semiconductor (MOS), complimentary MOS, Silicon Carbide (SiC)). In some examples, multiple FETs can be paralleled and packaged as a power module where the respective FET's in the power module can be diagnosed for reliability as described herein. Thus, the FET 110 described herein can include a single FET or a FET module with one or more FETs configured therein. As described herein, the device 100 is configured to monitor and collect diagnostic information (e.g., diagnostic signatures represented as voltages) from the FET 110 based on the state of the drive signal 116.

Depending on the state of the drive signal 116 (e.g., zero-volt control state or negative-voltage control state), which controls operations of the output circuit 114 to bias the gate of the FET 110, different internal current paths of the FET 110 can pass current through the FET. For example, the control logic 130 is configured to set the state of the drive signal 116 to control whether current passes through the channel of the FET or through the body diode (see, e.g., FIG. 3). By controlling current through different paths of the FET, different parameters of the FET can be monitored (e.g., based on the source-to-drain voltage across the FET) and used to determine a level of degradation for the FET based on signatures gathered from the differing current paths through the FET.

As used herein, the term signature refers to a voltage sampled across the FET 110 (e.g., the source-to-drain voltage across the FET) in response to a respective state of the drive signal 116. For example, in a first state of the drive signal 116, a first voltage can be sampled to provide a first signature representing a present reliability status of the FET after use. In a different state of the drive signal 116, a second voltage can be measured from the FET 110 to provide a second signature representing a junction temperature of the FET. The second signature can be used to determine conditions of the FET in a non-degraded state of the FET before use. Comparisons between the respective signatures and related values derived from such signatures can be used to determine the level of degradation of the FET 110 as described herein.

By way of example, the control logic 130 is configured to generate the drive signal 116 to control the output circuit 114 to drive the FET 110 and, based on the respective state of the drive signal, to conduct current through the body diode 120 or the channel of FET. In one example, the control logic 130 can include discrete components. In other examples, the control logic 130 can include a controller, processor, digital signal processor, gate array, or controller circuit.

A measurement circuit 140 is configured to sample voltages across the FET 110 in response to the drive signal 116 (or signals). The control logic 130 reads the sample voltage values (e.g., from an analog to digital conversion (ADC) by the measurement circuit 140). The control logic 130 is configured to compare the sampled voltages (e.g., current health signature of the FET) to stored health signatures (e.g., voltage values) of the FET 110 representing a non-degraded condition of the FET. Based on the comparison between the stored and/or computed state representing the non-graded state of the FET 110 and the present sampled state of the FET, the control logic 130 determines the level of degradation of the FET, as described herein.

As a further example, the measurement circuit 140 is configured to sample a first voltage across the FET 110 in response to a first state of the drive signal 116 (e.g., zero-gate bias applied to FET). The measurement circuit 140 is configured to sample a second voltage in response to a second state of the drive signal (e.g., negative-gate bias applied to FET). A switch device 150 is coupled between the FET and measurement circuit 140. The switch device is configured to provide a voltage measurement of the FET 110 (e.g., voltage across the FET from source to drain) in response to a monitor signal 154 (e.g., diagnostic signal) provided by the control logic 130. For example, an output of the control logic is coupled to a control terminal (e.g., gate terminal) of the switch device to provide the monitor signal. As used herein, the switch device 150 is configured to provide a voltage from the FET 110 in response to the monitor signal 154 and to apply the voltage received from the FET to the measurement circuit 140. For example, the switch device 150 can be can be any type of transistor device (e.g., BJT, FET) or can be implemented as an electrical device, such as a solid-state relay, or an electro-mechanical switch or relay device. In one example, the switch device 150 is a FET that includes a drain terminal coupled to a drain terminal of the FET 110 and a source terminal coupled to the measurement circuit 140 to enable measurement of the first voltage and the second voltage described herein.

In an example, the control logic 130 is configured (see, e.g., junction temperature logic FIG. 2) to analyze the second voltage value to determine a junction temperature value of the FET 110. For example, the control logic 130 is configured to determine the junction temperature from a lookup table or by computing a thermal equation based on the second voltage value.

As a further example, the control logic 130 also is configured (see, e.g., reference voltage logic FIG. 2) to analyze the junction temperature value to determine a reference voltage value that indicates a reliability state for the FET based on the junction temperature value of the FET and representative of the voltage across the FET in the non-degraded state. That is, the reference voltage can be determined based on the second sampled voltage. The reference voltage can be determined from another lookup table based on the determined junction temperature. The reference voltage is representative of a voltage across the FET in a non-degraded state. The control logic 130 is further configured to determine a difference between the first voltage value and the reference voltage value and to compare the difference to a degradation threshold to determine the level of degradation for the FET 110. For example, the degradation threshold can be a value stored in memory representing an amount of expected voltage drift between degraded and non-degraded states of the FET. For example, if the difference is determined to be below the degradation threshold, the FET may still be considered to be operating within expected operating parameters and thus not require replacement. If the difference is above the degradation threshold, the level of degradation of the FET can be significant (e.g., nearing failure and potentially unreliable), such that it may require replacing.

As mentioned, the control logic 130 is configured to determine a level of FET degradation. Advantageously, the control logic can determine the level of degradation without employing separate temperature sensors to determine junction temperature for the FET 110. Temperature measurement as described herein can be performed more accurately and less expensively than using a temperature-sensor applied to the FET 110 because the temperature information for the FET 110 is derived from a measurement of FET voltage that directly relates to the junction temperature in contrast to a separate sensor that may be located at some distance and spaced apart from the respective junction. In some examples, the level of degradation may be stored as an output in memory and/or provided in an output signal to an external system or device. The output thus can be monitored over time and used to signify whether or not the FET should be replaced.

Figure 2:
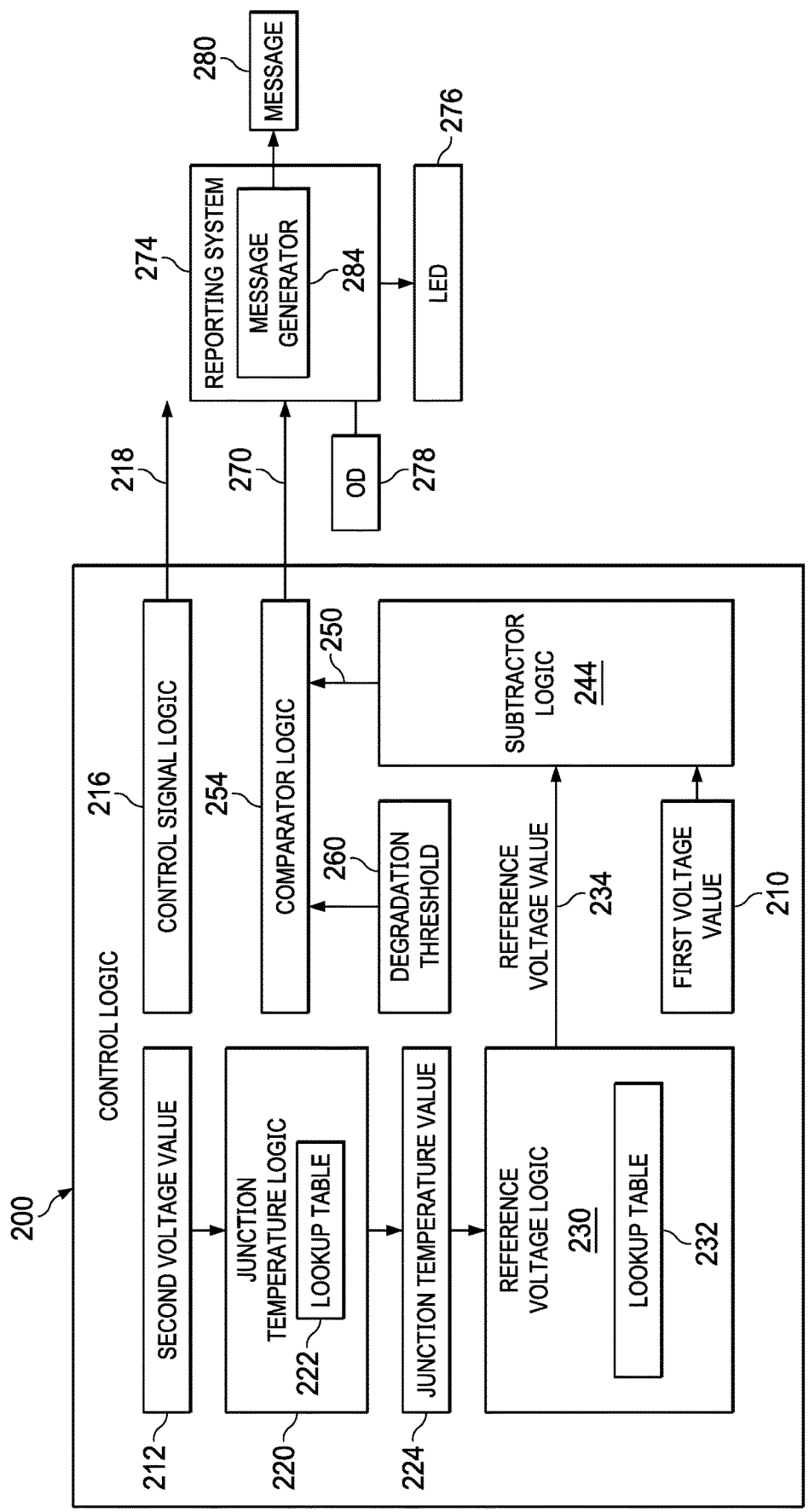
FIG. 2 illustrates an example block diagram of a control logic to determine a level of degradation for a field effect transistor.

FIG. 2 illustrates an example of control logic 200 configured to determine a level of degradation for a FET, such as the FET 110 of FIG. 1. For example, the control logic 200 may be implemented as the control logic 130 in FIG. 1. A first voltage value 210 and a second voltage value 212 are received at an input of the control logic 200 (e.g., from measurement circuit 140 of FIG. 1). For example, each of the voltage values 210 and 212 are stored in memory (not shown) as data representing voltage values sampled across a FET (e.g., FET 110 of FIG. 1). As described with respect to the example of FIG. 6, a multiplexer and an analog to digital converter (ADC) can be employed in a measurement circuit to provide digital readings of the first voltage value 210 and the second voltage value 212 in response to measurement and read signals (see e.g., measurement and read signals in FIG. 6) generated by the control logic 200.

As an example, control signal logic 216 (e.g., output buffer to generate gate control voltages) is configured to provide a control signal 218 (or signals) to control operation of the FET. For example, the control signal logic 216 is a driver configured to provide the control signal 218 to the output circuit 114 of FIG. 1 for controlling the FET in different operating states, as disclosed herein. The control signal 218 thus is generated to operate the FET in different operating states to enable diagnosis of the present condition of the FET including to determine a level of degradation of the FET. For example, the control signal logic 216 is configured to provide the control signal 218 in a first state to direct current through the channel of the FET and generate the first voltage value 210 representing a potential degraded state of the FET. The control signal logic 216 is also configured to provide the control signal 218 in a second state of to direct current through the body diode of the FET to generate a second voltage value 212 used to determine a non-degraded state of the FET.

By way of example, the first voltage value 210 corresponds to the first signature that provides a potential indicator of FET degradation. As mentioned above with respect to FIG. 1, the first voltage value 210 represents channel current which is generated based on the state of the control signal 218 (e.g., zero-volt gate bias to induce channel current as channel is not pinched off with zero-volt gate bias). The second voltage value 212 corresponds to the second signature based on a second state of the control signal 218 (e.g., a negative-voltage biasing of the FET) to determine a junction temperature of the FET. For example, the second voltage value 212 is sampled to represent an operating state of the FET when current flows through the body diode of the FET in response to the negative voltage initiated by the control signal 218 (e.g., as applied by output circuit 114 of FIG. 1). In order to determine the present condition and degradation status of the FET, an evaluation of the FET should occur at a junction temperature that was recorded previously and before degradation of the FET has occurred due to use. This information can be derived from the second voltage value, as disclosed herein.

As a further example, the control logic 200 includes junction temperature logic 220 that is configured to determine a junction temperature value 224 based on the second voltage value 212. The junction temperature logic 220 may be implemented as instructions to perform a lookup function and/or compute a thermal curve to determine junction temperature, or as hard-wired circuits configured to perform lookup or thermal computation. As one example, the junction temperature logic includes a lookup table 222. A given voltage level of the second voltage value 212 can be employed by the junction temperature logic 220 to index into the lookup table 222 (e.g., first lookup table) of stored FET voltage values to determine a junction temperature value 224 that is correlated to the second voltage value. In another example, a thermal equation may be programmed (e.g., as instructions executable by a processor) to compute a curve representing the lookup table 222 of junction temperature values that plot junction temperatures based on voltage sampled across the FET from which a junction temperature can be derived.

The control logic 200 includes reference voltage logic 230 that is configured to determine a reference voltage value 234 based on the junction temperature value 224. The reference voltage logic 230 may be implemented as instructions to perform a lookup function and/or compute a thermal curve to determine reference voltage, or hard-wired circuits configured to perform lookup or reference voltage computations. For example, the reference voltage logic 230 includes a lookup table 232 (e.g., second lookup table) to index stored reference voltage values to determine a reference voltage value 234 that is correlated to the junction temperature value 224. The reference voltage value 234 represents the non-degraded voltage of the FET at a given temperature.

The control logic 200 also includes subtractor logic 244 (e.g., instructions to perform digital subtraction or analog subtraction circuit) and comparator logic 254 (e.g., instructions to perform digital comparison or analog comparator) to further analyze the level of degradation of the FET. The subtractor logic 244 is configured to determine a difference (e.g., a voltage value) 250 between the first voltage value 210 and the reference voltage value 234. The comparator logic 254 is configured to compare the difference to a degradation threshold 260 to determine the level of degradation for the FET and is provided as a degradation output signal 270 (e.g., from comparator output) based on the difference 250 being detected below the degradation threshold. The degradation output signal 270 may be stored in memory (not shown). The degradation threshold 260 represents an amount of tolerable drift between voltages measured across the FET when it had not previously been cycled and how far the voltage across the FET has drifted due to continued use over time. The degradation threshold 260 can be stored in a memory or register (not shown). In some examples, the degradation threshold 260 may be programmable in response to a user input.

A reporting system 274 receives the degradation output signal 270 from the control logic 200. The reporting system 274 can include a programmable logic controller (PLC), a standalone computer, or other computing device capable of activating an output or generating a message based on the degradation output signal 270. In an example, the degradation output signal 270 is employed by the reporting system 274 to activate a light emitting diode (LED) 276 to alert an operator to replace the FET. For example, if the degradation output signal 270 indicates that the difference 250 is less than the degradation threshold 260, then the LED 276 may have a first color (e.g., green) indicating an acceptable amount of degradation.

If the degradation output signal 270 indicates that the difference is equal to or greater than the degradation threshold 260, the LED may have a second color (e.g., red) indicating a potentially degraded condition in need of replacement. In another example, an output device (OD) 278 (e.g., PLC output module) can be employed by the reporting system 274 to signal at least one other system concerning a potential problem with the FET. Additionally or alternatively, in some examples, the reporting system 274 is configured to generate an electronic message 280 (e.g., e-mail, text message) that is communicated to the other system by a message generator 284 (e.g., email server, text generator service) operating in the reporting system.

By using the voltage values 210 and 212 (e.g., voltage measurements across the FET) to determine a level of FET degradation, as described herein, a separate sensor to sense the FET junction temperature can be eliminated, which mitigates both complexity and costs with respect to existing temperature-sensor approaches. Also, by using the second voltage value 212 to determine FET junction temperature, more accurate junction temperatures can be determined over existing temperature sensors because the junction temperature is determined directly from the dynamics internal to the FET (e.g., current flows through the body diode or FET in response to control signals) as opposed to indirectly and less accurately at a location away from the FET junction (e.g., sensor located on FET integrated circuit package) where a separate sensor may be deployed.

Figure 3:
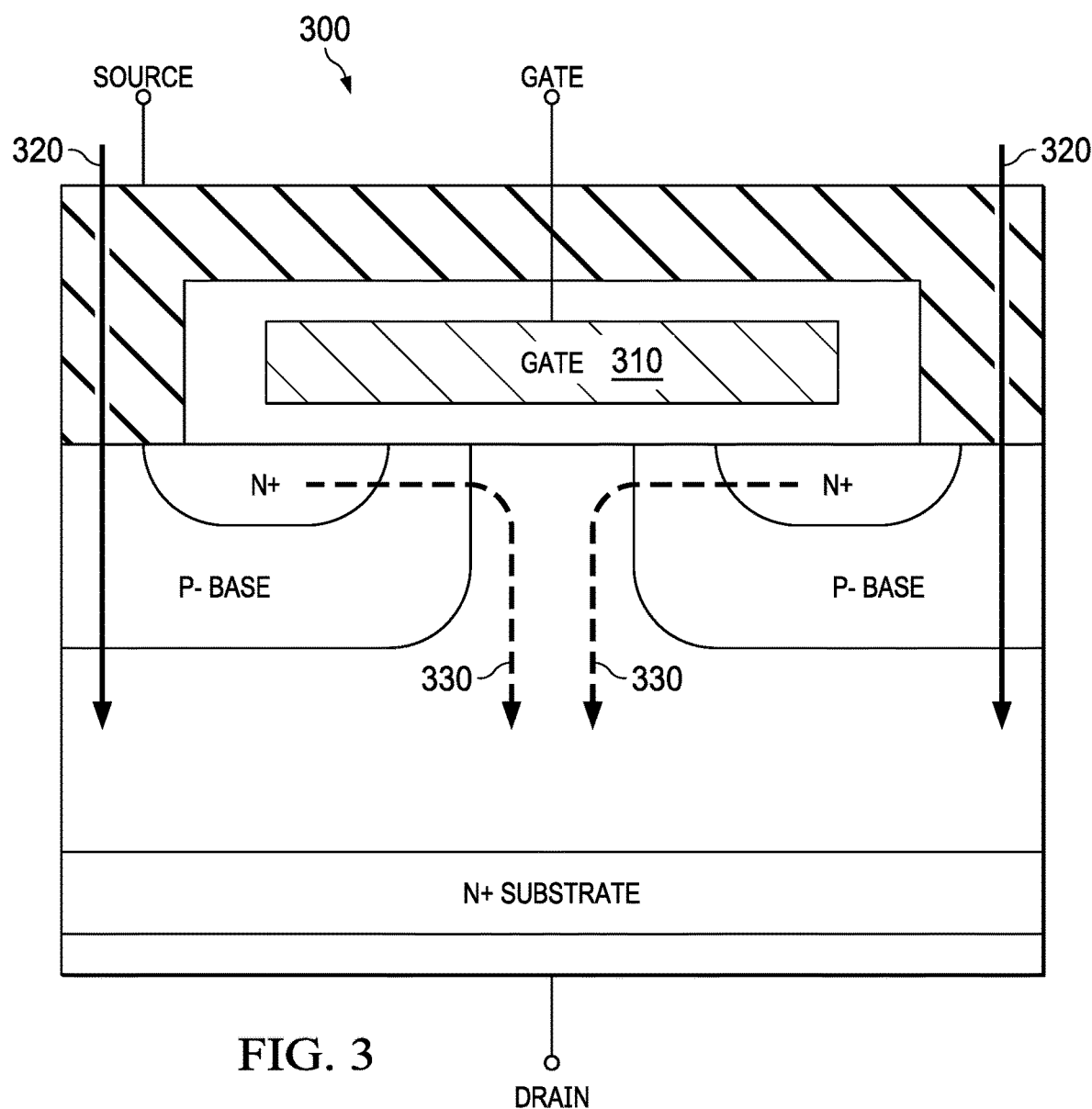
FIG. 3 illustrates a cross-sectional view of an example silicon carbide field effect transistor device showing alternate current paths through the device based on different voltages applied to a gate of the device.

FIG. 3 illustrates an example field effect transistor device 300 showing alternate current paths through the device based on voltages applied to a gate 310 of the device. For example, the FET device 300 can be an SiC FET, such as the FET 110 of FIG. 1. As an example, when a zero-volt gate-to-source voltage (VGS) is applied to the gate 310 (e.g., by output circuit 114), current flows through path 1 of the device represented at 330 and flowing through the channel of the device in response to the zero-volt bias. When a negative VGS is applied to the gate 310 (e.g., by output circuit 114), current takes an alternate internal path through path 2 that includes the body diode of the device shown as and represented by lines ending at 320. Thus, when VGS is zero volts, current flows through the channel and when VGS is negative, current flows through the body diode of the FET. In this manner, two separate voltage signatures—a first signature based on zero-bias and a second signature based on negative bias—can be gathered representing channel voltage and die temperature respectively. As disclosed herein, the signatures can be analyzed with respect to the degradation threshold to determine a level of degradation for the FET.

Figure 4:
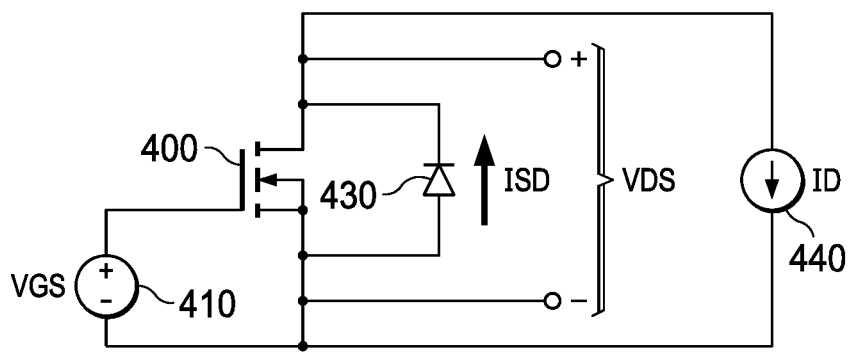
FIG. 4 illustrates an example of a circuit to measure voltage and current flows for a field effect transistor device.

FIG. 4 illustrates a circuit to measure voltage and current flows for a field effect transistor device 400. For example, depending on the polarity of voltage source 410, current ID flows through either a channel of the FET device 400 or the body diode 430. In this example, the current ID is represented as current source 440 which sources current when the voltage source 410 is applied to the gate of the FET device 400.

Figure 5:
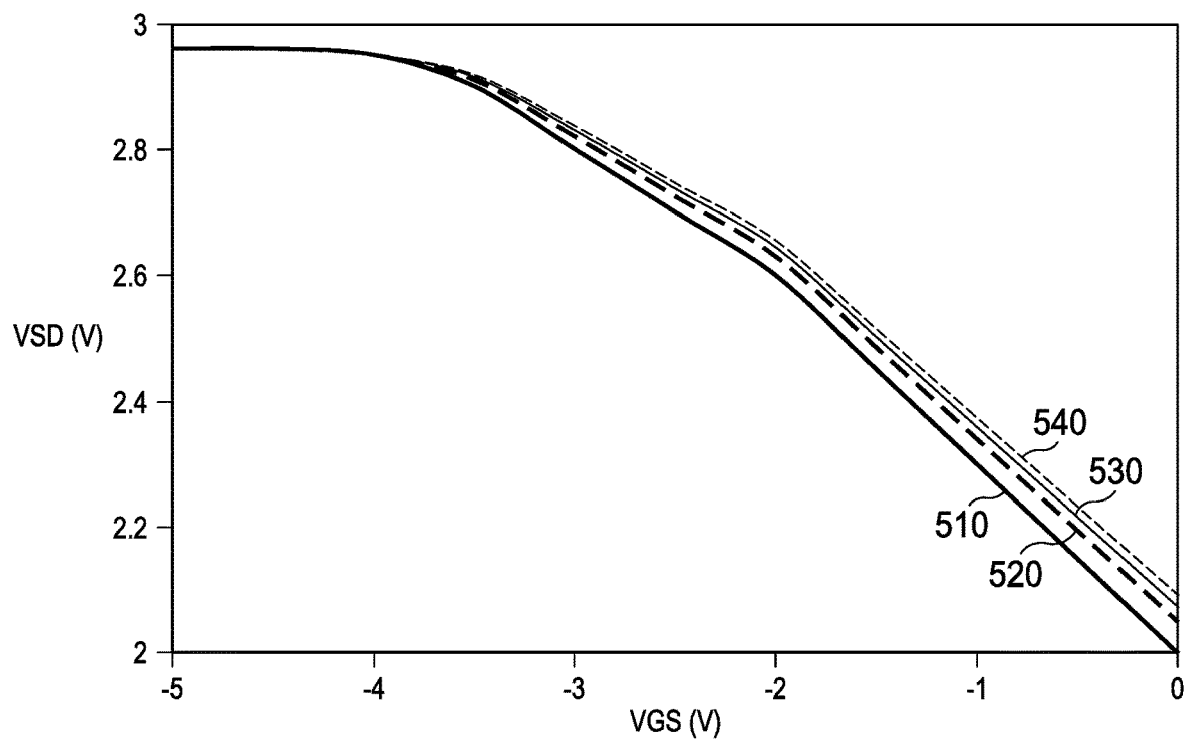
FIG. 5 illustrates an example diagram illustrating the effects of gate biasing on an example field effect transistor under test.

FIG. 5 illustrates an example diagram 500 illustrating the effects of gate biasing on a Metal Oxide Semiconductor FET (MOSFET) under test. Source-to-Drain voltage (VSD) is represented on the vertical axis of the diagram 500 in volts and Gate-to-Source voltage (VGS) is represented on the horizontal axis in volts. The diagram includes a plurality of curves shown as curve 510, curve 520, curve 530 and curve 540. The curve 510 represents a relatively new device that has been cycled approximately 100 times under load (e.g., power cycling device junction temperature from 25° C. to 150° C.). Curve 520 represents the same device that has been cycled approximately 2000 times under load. Curve 530 represents the same device that has been cycled approximately 5000 times under load. Curve 540 represents the same device that has been cycled 10000 times under load. As mentioned previously with respect to FIGS. 1-4, VSD can be measured with 0V bias for VGS to generate a first signature and with negative VGS bias to generate a second signature. With 0V VGS bias, the source-to-drain current (ISD) (e.g., leakage current) will go through the channel of the MOS-FET (e.g., path 330 of FIG. 3). Thus, measured VSD at reference ISD can be used as an indicator for MOSFET die degradation. Shown in the diagram 500, at 0V on the vertical axis, VSD shifts from 2V to 2.1V after 10 k power cycles at 540, this is a signature that the MOSFET may eventually go to thermal runaway if VSD shifts further and beyond some threshold (e.g., the degradation threshold).

With enough negative VGS bias (e.g., above some negative threshold), the MOSFET channel pinches-off, and the ISD current will traverse through the body diode the MOSFET (e.g., path 320 of FIG. 3). Thus, the measured VSD at reference ISD can be used as an indicator for the die temperature. In the diagram 500, when VGS>−4V on the horizontal axis, VSD (vertical-axis) drifts over the illustrated power cycling test shown. Therefore, while VSD is constant for VGS<−4V, this shows VSD performance for the current path through the body diode and thus does not change due to cycling.

Figure 6:
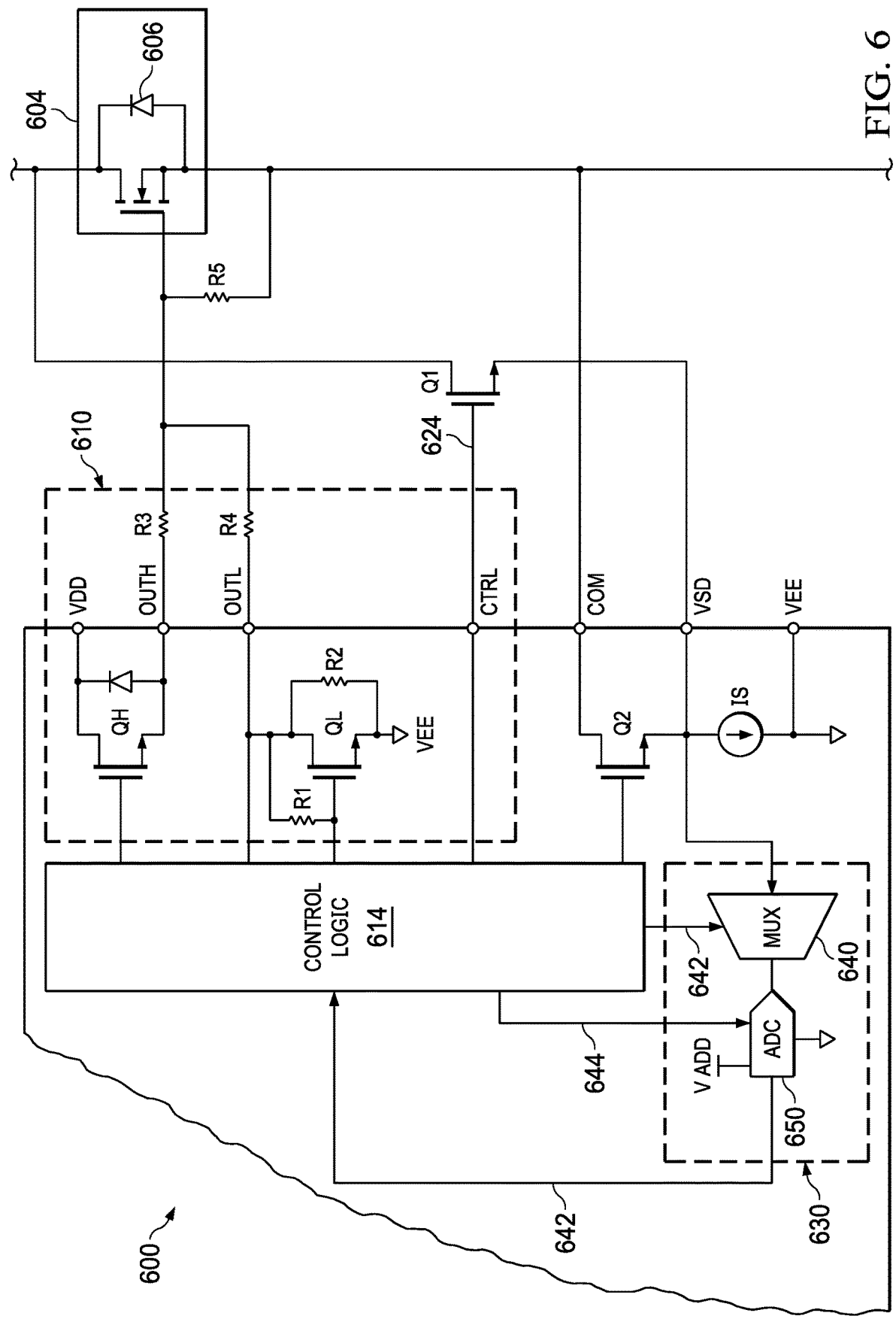
FIG. 6 illustrates an example of a circuit to determine a level of degradation for a field effect transistor.

FIG. 6 illustrates an example of a circuit 600 configured to determine a level of degradation for a field effect transistor (FET) 604 having a body diode 606. The circuit includes an output circuit 610 that is configured to drive the FET 604 based on control signals from control logic. For example, the output circuit 610 corresponds to the output circuit 114 of FIG. 1 and the control logic 614 may correspond to the control logic 130 or 200 disclosed herein.

In the example of FIG. 6, the output circuit 610 includes drive transistor QH and QL configured to drive the FET 604 during normal circuit operations. During diagnostic operations to determine FET degradation, the control logic 614 is configured to turn QH off. As shown, bias resistors R1 and R2 may be coupled between the gate and drain and source and drain, respectively, of QL. The output circuit 610 may include resistors R3 and R4 coupled between the sources of QL and QH, respectively, and the gate of FET 604. Another resistor R5 may be coupled between the gate and source of FET 604.

Output transistor device Q1 (e.g., output switch device, output FET device) has a drain terminal coupled to the drain terminal of the FET 604 and a source terminal that is coupled to current source IS and to an input of multiplexer 640. As an example, the control logic is configured to pull the gate terminal of Q1 low during normal operations of the circuit 600 (e.g., during non-diagnostic modes). Output transistor device Q2 has a drain terminal coupled to the drain terminal of the FET 604 and a source terminal coupled to current source IS and coupled to the input of the multiplexer 640. The control logic 614 is configured to pull the gate terminal of Q2 during diagnostic operations of the circuit 600 and responds to the monitor signal 624 described herein. Transistor device Q1 thus is turned on during diagnostic mode and switch device Q2 is turned off by monitor signal 624 during diagnostic mode to provide voltages across the FET 604 to be sampled by a measurement circuit 630 (e.g., similar to 140 of FIG. 1). Current source IS provides a bias path between the source terminal of the FET 604 and negative supply rail VEE. Current source IS (e.g., 500 uA) is on in both diagnostic and normal operations to facilitate voltage stability for the FET 604 when taking readings across the device, where the current source IS bypassed by Q2 during the normal operation mode when Q2 is turned on.

As shown in the example of FIG. 6, the measurement circuit 630 includes multiplexer 640 and an analog to digital converter (ADC) 650. The multiplexer 640 is configured to sample voltages from the drain terminal of the FET 604 during different FET operating states. The multiplexer thus provides the sampled FET voltage to the ADC 650 in response to measurement signal 642. For example, the control logic 614 provides the measurement signal to control the multiplexer 640 for sampling the voltage across the FET 604 during respective first and second states of the drive signal. The multiplexer 640 thus is configured to provide the first voltage and the second voltage measured across the FET 604, as described herein, to the ADC 650 in response to the measurement signal 642 from the control logic 614. The ADC 650 is configured to convert the sampled first and second voltages to respective digital values that are provided at 642 to the control logic 614 for further processing as disclosed herein (see, e.g., FIG. 2). For example, the ADC 650 is configured readout digital values at 642 in response to a request 644 from the control logic 614. The respective ADC values at 642 thus represent a first voltage value corresponding to the first voltage and a second voltage value corresponding to the second voltage measured across the FET 604.

By way of further example, the control logic 614 is configured to turn QL off during the first voltage measurement of the FET, which holds the FET 604 in an off state but the channel is not completely pinched off to provide current to the channel path of the FET 604. During the second voltage measurement of the FET 604, QL is turned on (e.g., by control logic 614), which has the effect of applying a lower voltage (e.g., negative in this example) to the gate of the FET 604. The negative gate voltage a different internal current path to flow inside the FET 604 (e.g., the body diode path of the FET), as described with respect to FIG. 3. As a result, the voltage measured across the FET when the gate of FET is driven negative captures a different signature of the FET relating to junction temperature.

Figure 7:
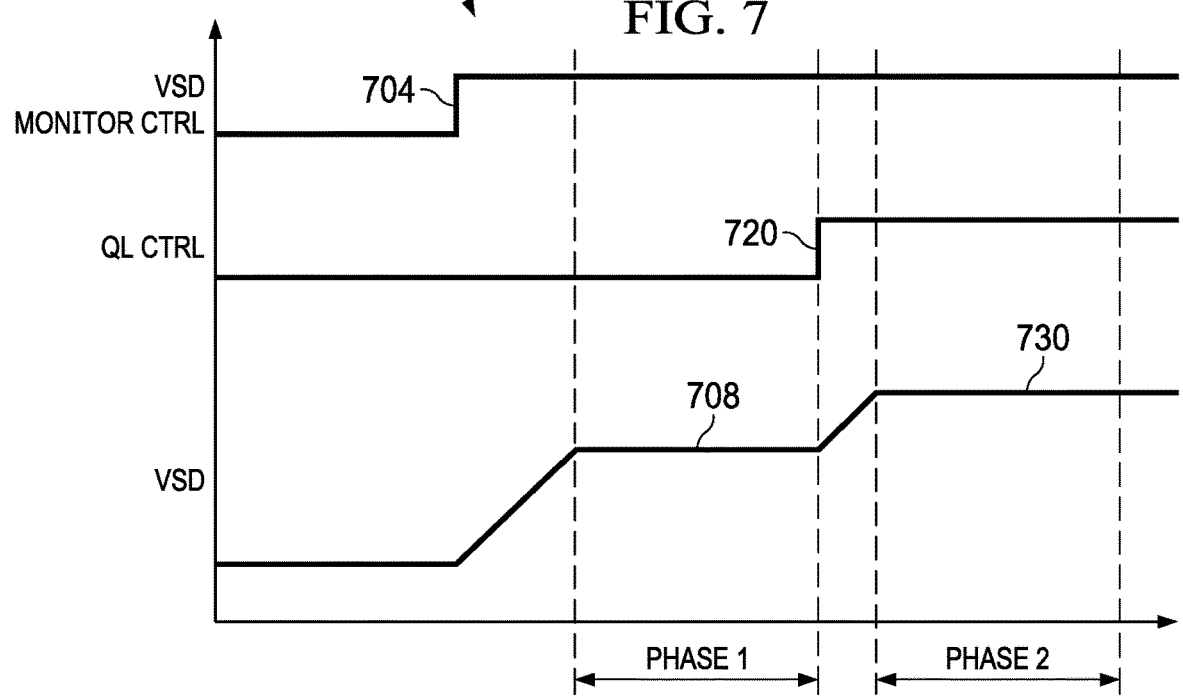
FIG. 7 illustrates an example of a signal diagram for the circuit of FIG. 6.

FIG. 7 illustrates an example of a signal diagram 700 for the circuit 600 of FIG. 6. During the VSD measurement, a control signal in the control logic 614 of FIG. 6 is driven high and turn on the Q1 switch device as shown at 704 of FIG. 7. Current IS will pass through the body diode 606 during this time period. For phase 1 measurement shown at 708 to provide the first signature, driver QL is off, and the output OUTL from QL is floating, because external circuit has resistor R5 between gate and source of FET 604. The gate for FET 604 will be 0V gate biased during phase 1 signature readings of VSD measurements at 708. After phase 1 VSD measurements at 708, QL is turned on at 720, where the FET 604 gate will be connected to VEE which is negative through QL. Then, VSD can be measured again at 730 for a phase 2 measurement, which provides a second signature, as disclosed herein. Measured VSD for both cases will be converted to digital signals through the ADC 650 and used by control logic 614 for FET degradation analysis as described herein.

Figure 8:
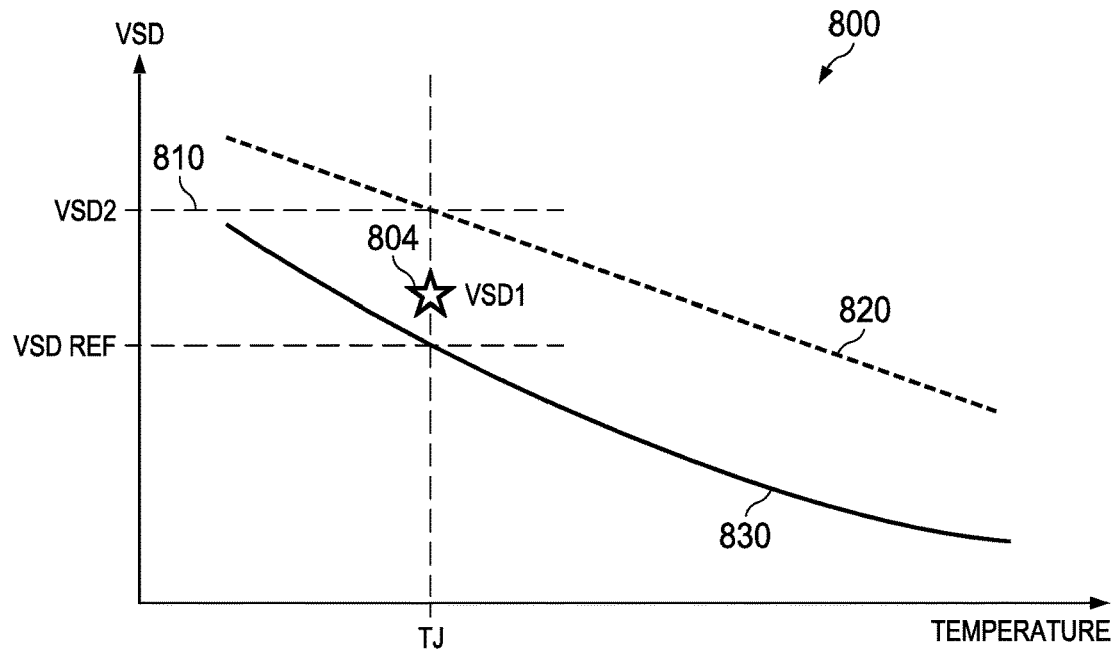
FIG. 8 illustrates an example diagram of control logic processing to retrieve values from lookup tables that are employed to determine a level of degradation.

FIG. 8 illustrates an example diagram 800 of control logic processing to retrieve values from lookup tables that are employed to analyze voltages received from a field effect transistor to determine a level of degradation. The diagram 800 demonstrates how to analyze VSD voltages received from a field effect transistor, such as FET 604 of FIG. 6 and with respect to different curves that are based on different voltages applied to the transistor. At 804, an initial voltage is measured and labeled VSD1, which represents readings taken from the first diagnostic phase described herein (PHASE 1 of FIG. 7) and represents a first voltage (e.g., signature) of the FET in a potentially degraded state. At 810, a second voltage reading is taken and labeled VSD2 (e.g., corresponding to PHASE 2 VSD in FIG. 7).

A curve 820 or data representing points along the curve 820 can be stored in memory as a lookup table. For example, the control logic 614 uses the value of VSD2 (e.g., value used to locate a point in a table or curve) to determine the junction temperature TJ of the FET. The control logic is configured to determine a reference voltage value based on another curve 830, which can also be stored in memory as a lookup table. For example, the reference voltage value VSD REF is determined by correlating the junction temperature TJ to a VSD value along the curve 830. The reference voltage value VSD REF correlates VSD to a junction temperature values for the FET 604 when VGS applied to the FET is 0V. As described herein, VSD REF is then subtracted from VSD1 to form a difference value. The difference value is compared to a degradation threshold to determine an amount that VSD1 has drifted from VSD REF due to cycling. If the difference value is below the degradation threshold, the FET can be deemed suitable for further operations. If the difference value is above the degradation threshold, the FET can be flagged for potential replacement (e.g., based on a degradation output signal), which can be directed to the reporting system 274 of FIG. 2 to initiate further action by a user.

Figure 9:
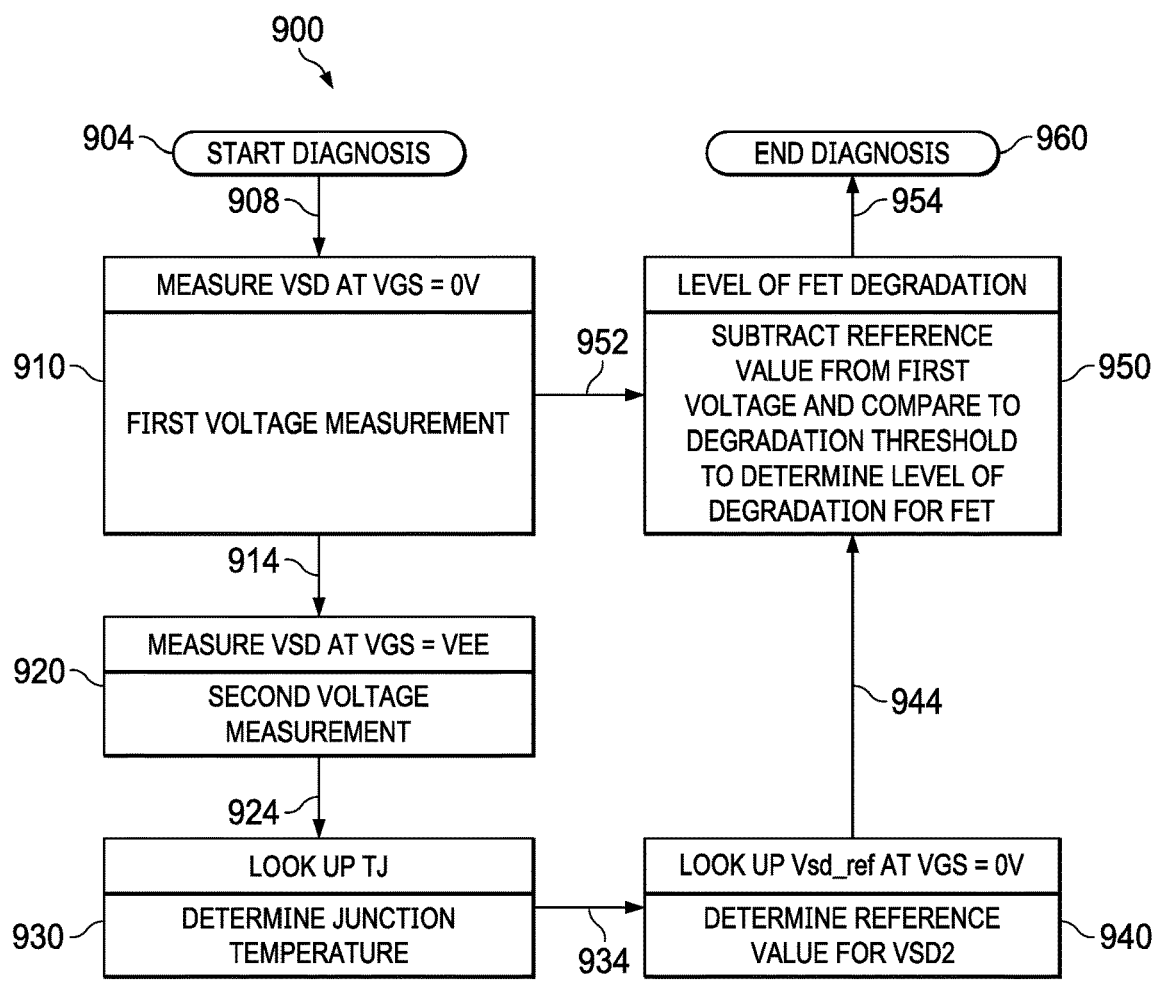
FIG. 9 illustrates an example of a state diagram representing a set of instructions that can be executed by a processor to determine a level of degradation for a field effect transistor.

FIG. 9 illustrates an example of a state diagram 900 representing a set of instructions that can be executed by a processor (e.g., control logic 130 or 614, control logic 200) to determine a level of degradation for a FET (e.g., FET 110, FET 604). At 904, the circuits described herein enter diagnostic mode which represents a starting start. At 908, the control logic transitions to 910 to start diagnosis of the FET to determine the level of degradation. At 910, the instructions cause the control logic to generate a first drive signal to cause an output driver (e.g., output circuit 114 driver QL) to apply a first gate voltage to a gate of a field effect transistor (FET) in response to the first drive signal. This includes instructions to store a first voltage value representative of a voltage across the FET in response to the first gate voltage. At 914, the instructions cause the control logic to transition to 920 after the first voltage value has been measured and stored.

At 920, the instructions cause the control logic to generate a second drive signal to cause the output driver (e.g., output circuit 114, driver QL) to apply a second gate voltage to the gate of the FET in response to the second drive signal. The second gate voltage is different from the first gate voltage (e.g., second gate voltage is negative and first gate voltage is zero). The state 920 includes storing a second voltage value representative of a voltage across the FET in response to the second gate voltage at 920. At 924, the instructions cause the control logic to transition to 930 after the second voltage value has been stored. At 930, a junction temperature (TJ) value for the FET is determined based upon comparison to a lookup table for the value stored at 920. At 934, the instructions cause the control logic to transition to 940 after the junction temperature value has been determined.

At 940, the TJ value determined at 930 is converted to a reference voltage value that is correlated to the temperature of the FET when VGS is zero. For example, the junction temperature is applied as an index to a lookup table that is programmed to provide the reference voltage value based on the junction temperature at 934. At 944, the instructions cause the control logic to transition to 950 after the reference voltage value has been determined. At 950, the instructions cause the control logic to determine a level of degradation of the FET based on subtracting the reference voltage value from the first voltage value (e.g., VSD1) received from 952 to provide a difference value. Also, at 950, the difference value is compared to a degradation threshold which provides the level of degradation. In an example, instructions can store a degradation output in memory that is representative of the level of degradation of the FET. The degradation threshold defines an amount of drift due to power cycling of the FET at which indicates the FET should be replaced. For difference values below the degradation threshold, the FET can continue operations. For difference values detected above the degradation threshold, a degradation output signal can be generated indicating the FET should be replaced. After the level of degradation is determined at 950, the instructions cause the control logic to transition from 954 to 960, where the diagnostic routine ends.

Figure 10:
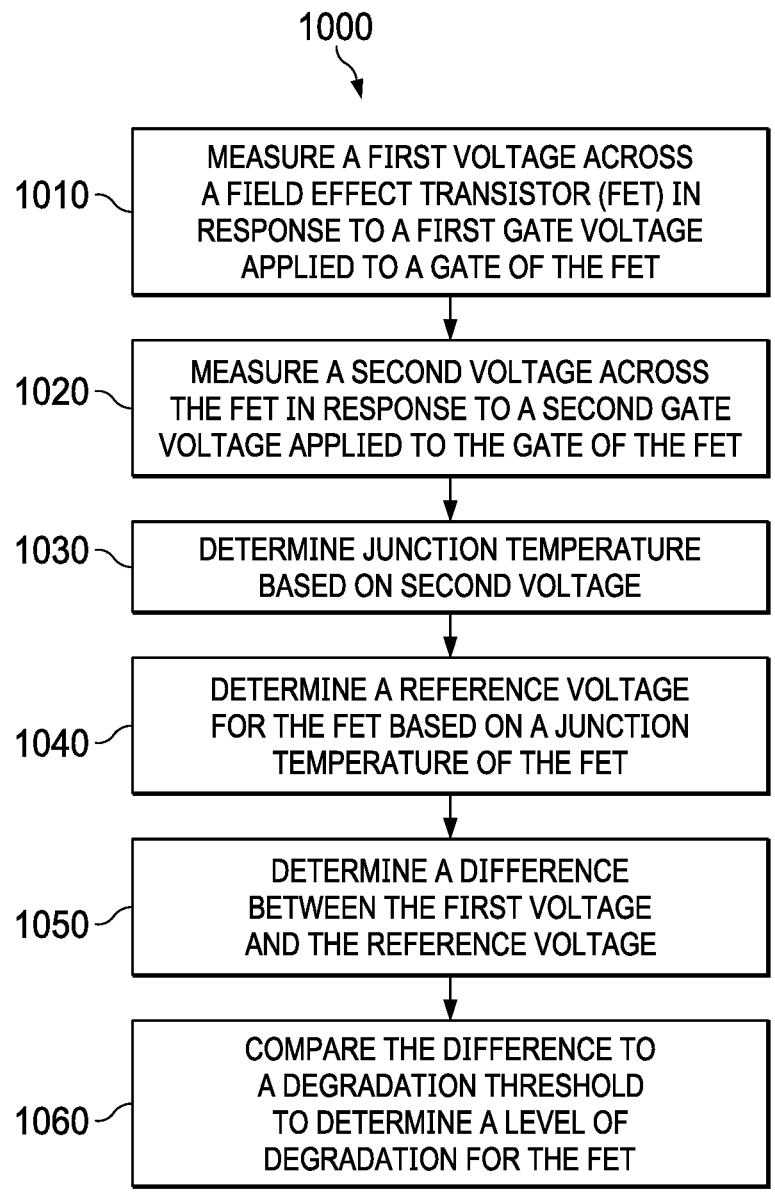
FIG. 10 illustrates an example of a method to determine a level of degradation for a field effect transistor.

FIG. 10 illustrates an example of a method 1000 to determine a level of degradation for a field effect transistor (FET). At 1010, the method includes measuring a first voltage across the FET in response to a first gate voltage applied to a gate of the FET (e.g., by measurement circuit 140 and 630). At 1020, the method 1000 includes measuring a second voltage across the FET in response to a second gate voltage applied to the gate (e.g., by measurement circuit 140 and 630), the second gate voltage being different from the first gate voltage. At 1030, the method 1000 includes determining a junction temperature for the FET based on the second voltage (e.g., by junction temperature logic 220).

At 1040, the method 1000 includes determining a reference voltage for the FET based on the junction temperature of the FET. The reference voltage is representative of a voltage across the FET in a non-degraded state at the junction temperature of the FET (e.g., by reference voltage logic 230). At 1050, the method 1000 includes determining a difference between the first voltage and the reference voltage (e.g., by subtractor logic 244). At 1060, the method 1000 includes comparing the difference to a degradation threshold to determine a level of degradation for the FET (e.g., by comparator logic 254). The method 1000 can also include generating a degradation output signal (e.g., at 274) indicating the level of degradation of the FET based on comparing the difference to the degradation threshold.

What have been described above are examples. It is, of course, not possible to describe every conceivable combination of components or methods, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A device, comprising:
   an output circuit comprising a transistor having a first gate, a source, and a drain, the output circuit configured to:
   receive a first drive signal at the first gate;
   drive a second gate of a field effect transistor (FET) to a first state, in response to receiving the first drive signal, the drain adapted to be coupled to the second gate; and
   drive the second gate of the FET to a second state in response to receiving a second drive signal; and
   a measurement circuit comprising a multiplexer configured to:
   sample a first voltage across the FET while the FET is in the first state; and
   sample a second voltage across the FET, while the FET is in the second state.

2. The device of claim 1, wherein the source is configured to receive a negative voltage with respect to a voltage at the drain.

3. The device of claim 1, further comprising control logic coupled to the output circuit and to the measurement circuit, the control logic configured to:
   produce the first drive signal;
   produce the second drive signal;
   determine a reference voltage responsive to the second voltage; and
   determine a first signature responsive to a difference between the first voltage and the reference voltage.

4. The device of claim 3, wherein the multiplexer has an input and an output, the input coupled to the FET, the measurement circuit further comprising an analog to digital converter (ADC) coupled to the output of the multiplexer.

5. The device of claim 4, further comprising a switch device configured to provide a voltage measurement across the FET to the input of the multiplexer in response to receiving a monitor signal from the control logic.

6. The device of claim 4, wherein the control logic comprises junction temperature logic configured to determine a junction temperature value of the FET based on the second voltage.

7. The device of claim 6, wherein the junction temperature logic includes a lookup table configured to store temperature data representative of junction temperature values that are correlated to respective FET voltage values such that the lookup table provides the junction temperature value of the FET based on the second voltage.

8. The device of claim 7, wherein the control logic comprises reference voltage logic configured to determine the reference voltage based on the junction temperature value.

9. The device of claim 8, wherein the lookup table is a first lookup table and the reference voltage logic comprises a second lookup table, the second lookup table configured to store reference voltage values for the FET that are correlated to respective junction temperature values and to provide the reference voltage for the FET based on the junction temperature value of the FET.

10. The device of claim 8, wherein the control logic further comprises:
    subtractor logic configured to determine a difference between the first voltage and the reference voltage; and
    comparator logic configured to compare the difference between the first voltage and the reference voltage to a threshold retrieved from memory to determine a value.

11. The device of claim 10, the comparator logic further comprising a comparator output configured to generate an output signal based on the value.

12. The device of claim 11, further comprising a reporting system configured to receive the output signal, the reporting system further configured to:
    activate a light emitting diode (LED) based on the output signal;
    activate an output device to specify a level of degradation based on the output signal; or
    communicate an electronic message comprising data specifying the level of degradation based on the output signal.

13. The device of claim 1, wherein the FET is a Silicon Carbide (SiC) transistor.

14. A system, comprising:
a field effect transistor (FET) having a gate;
control logic configured to produce a first drive signal;
an output circuit configured to apply a first gate voltage to the gate in response to the first drive signal, to set the FET to a first state; and
a measurement circuit configured to sample a first voltage across the FET while the FET is in the first state;
wherein the control logic is further configured to produce a second drive signal;
wherein the output circuit is further configured to apply a second gate voltage to the gate in response to the second drive signal, to set the FET to a second state;
wherein the measurement circuit is further configured to sample a second voltage across the FET while the FET is in the second state; and
wherein the control logic is further configured to:
 determine a reference voltage responsive to the second voltage; and
 determine a first signature responsive to the first voltage and the reference voltage.

15. The system of claim 14, wherein the FET is a first FET and the gate is a first gate, and wherein the output circuit further comprises a second FET having a second gate, a source, and a drain, the second gate configured to receive the first drive signal from the control logic.

16. The system of claim 14, wherein the measurement circuit further comprises:
a multiplexer having an input and an output, the input coupled to the FET; and
an analog to digital converter (ADC) coupled to the output of the multiplexer.

17. The system of claim 16, wherein the control logic comprises junction temperature logic configured to determine a junction temperature value of the first FET based on the second voltage.

18. The system of claim 14, wherein the FET is a SiC FET.

19. A device, comprising:
control logic;
an output circuit coupled to the control logic, the output circuit comprising:
 a first transistor having a first gate, a first source, and a first drain, the output circuit configured to:
  drive a second gate of a field effect transistor (FET) to a first state, in response to receiving a first drive signal from the control logic at the first gate; and
  drive the second gate of the FET to a second state, in response to receiving a second drive signal from the control logic at the first gate;
 a third transistor having a third gate, a second source, and a second drain, the second drain adapted to be coupled to the FET and the third gate coupled to the control logic;
a current source coupled to the second source; and
a measurement circuit coupled to the control logic and to the second source, the measurement circuit configured to:
 sample a first voltage across the FET while the FET is in the first state; and
 sample a second voltage across the FET while the FET is in the second state.

20. The device of claim 19, the output circuit further comprising:
a first resistor having a first resistor terminal and a second resistor terminal, the first resistor terminal coupled to the first source and the second resistor terminal adapted to be coupled to the second gate;
a fourth transistor having a fourth gate, a third source, and a third drain, the fourth gate coupled to the control logic; and
a second resistor having a third resistor terminal and a fourth resistor terminal, the third resistor terminal coupled to the third drain and the fourth resistor terminal coupled to the second resistor terminal.

21. The device of claim 19, wherein the measurement circuit comprises:
a multiplexer coupled to the control logic and to the second source; and
an analog to digital converter coupled to the multiplexer and to the control logic.

22. A method comprising:
producing, by control logic, a first drive signal;
applying, by an output circuit, a first gate voltage to a gate of a field effect transistor (FET) in response to receiving, from the output circuit, the first drive signal, to set the FET to a first state;
sampling, by a measurement circuit, a first voltage across the FET while the FET is in the first state;
producing, by the control logic, a second drive signal;
applying, by the output circuit a second gate voltage to the gate in response to receiving the second drive signal from the control logic, to set the FET to a second state;
sampling, by the measurement circuit, a second voltage across the FET while the FET is in the second state;
determining, by the control logic, a reference voltage responsive to the second voltage; and
determining, by the control logic, a first signature responsive to the first voltage and the reference voltage.

* * * * *